United States Patent
Suzuki et al.

[11] Patent Number: 5,677,113
[45] Date of Patent: Oct. 14, 1997

[54] METHOD FOR ASHING A PHOTORESIST RESIN FILM ON A SEMICONDUCTOR WAFER AND AN ASHER

[75] Inventors: Shinji Suzuki, Kawasaki; Kyohei Seki, Yamato; Nobutoshi Ebashi, Sagamihara; Tetsuji Arai, Yokohama, all of Japan

[73] Assignee: Ushiodenki Kabushiki Kaisha, Tokyo, Japan

[21] Appl. No.: 436,679

[22] Filed: May 8, 1995

Related U.S. Application Data

[63] Continuation of Ser. No. 971,992, Oct. 16, 1992, abandoned.

[30] Foreign Application Priority Data

Oct. 18, 1991 [JP] Japan .................. 3-297610

[51] Int. Cl.⁶ .................................................. G03F 7/42
[52] U.S. Cl. ........................ 430/329; 134/1; 156/643.1
[58] Field of Search ............................ 430/329; 134/1, 134/31, 39; 156/635, 643, 646

[56] References Cited

U.S. PATENT DOCUMENTS

| | | |
|---|---|---|
| 3,890,176 | 6/1975 | Bolon .................................. 156/2 |
| 4,756,047 | 7/1988 | Hayashi ............................ 15/306 B |
| 4,885,047 | 12/1989 | Ury et al. ............................ 156/345 |
| 5,176,782 | 1/1993 | Ishibashi ............................ 156/345 |

FOREIGN PATENT DOCUMENTS 2196611  3/1974  France .

OTHER PUBLICATIONS

Extended Abstracts of the 15th Conf. on Solid State Devices and Materials, 1983, "UV Resist-Stripping for High-Speed and Damage-Free Process", Tokyo, Japan, pp. 125-128, Ozawa et al.

*Primary Examiner*—Kathleen Duda
*Attorney, Agent, or Firm*—Keck, Mahin & Cate

[57] ABSTRACT

The object of the invention is to provide an ashing method and an asher in order to avoid damage to semiconductor components occurring during ashing of a photoresist resin film by active oxygen plasma and to avoid a long treatment time occurring in an ashing method using a low pressure mercury discharge lamp. According to the invention, this object is achieved by a method and an apparatus for ashing a photoresist resin film. In the method, a wafer provided with a photoresist resin film is placed in an ozone-containing atmosphere. An activated oxygen is produced through the radiation light of a discharge lamp, which emits a continuous spectrum in a wavelength range of 200 to 300 nm. The photoresist resin film is ashed by the activated oxygen.

2 Claims, 4 Drawing Sheets

FIG. 2

| Envelope | Discharge lamp | Ashing speed |
|---|---|---|
| Fused quartz glass | High pressure mercury discharge lamp | 2,0 μm/min |
| Synthetic quartz glass | High pressure mercury discharge lamp | 3,0 μm/min |
| Fused quartz glass | Metal halide discharge lamp | 2,5 μm/min |
| Known low pressure mercury discharge lamp | | 0,5 μm/min |

METHOD FOR ASHING A PHOTORESIST RESIN FILM ON A SEMICONDUCTOR WAFER AND AN ASHER

This is a continuation of Ser. No. 07/971,992, filed Oct. 16, 1992, now abandoned.

BACKGROUND OF THE INVENTION

1. Field of the Invention

The present invention relates to a method for ashing a photoresist resin film on a semiconductor wafer and to an asher. The invention more particularly relates to a method and to an apparatus for the removal of a photoresist resin film by ashing after carrying out photolithography, etching or ion implantation in a production process for a semiconductor device, such as LSI and the like.

2. Description of the Related Art

Nowadays for ashing a photoresist resin film on a semiconductor wafer, ashing by active oxygen plasma is carried out. In this ashing method, a photoresist resin film is oxidized by plasma-activated oxygen, decomposed and, in this way, removed from the semiconductor wafer, as is, e.g., described in App. Phys. Lett. 59 (10), Sep. 2, 1991, pp 1194 to 1196.

A merit of this method is that the ashing treatment for the photoresist resin film is rapidly performed. However, it is considered to be a demerit of this measure that the charged particles in the plasma, such as electrons, ions and the like, collide with the wafer, which causes a distortion of the crystal lattice in the wafer. As a result, the semiconductor device is damaged and there is a deterioration of electronic characteristics.

Of late, an ashing method has been proposed in which ultraviolet rays are applied and which avoids damage to the semiconductor device. The light source used is a low pressure mercury discharge lamp, such as is, e.g., described in ISPC-7 Eindhoven, July 1985, paper number P-13-7.

In this case, a semiconductor wafer provided with a photo-resist film is placed in an ozone-containing atmosphere and irradiated by a low pressure mercury discharge lamp. The low pressure mercury discharge lamp used for this purpose is a line spectrum lamp, which intensely emits light with a wavelength of 253.7 nm.

The ozone is decomposed by the radiation with a wavelength of 253.7 nm and liberates activated oxygen. An ashing reaction is produced by contact between the activated oxygen and the photoresist resin film.

Although this has the merit of not damaging the semiconductor device, it has the demerit that the treatment speed is reduced to approximately ¼ of the treatment speed in the case of conventional ashing by active oxygen plasma.

The reason for this is that ozone very readily absorbs light with a wavelength of 253.7 nm, that is to say, ozone has a high absorption coefficient for light with a wavelength of 253.7 nm and, therefore, the ultraviolet rays emitted by the low pressure mercury discharge lamp, i.e. the light with a wavelength of 253.7 nm, is largely immediately absorbed by the ozone close to the light source or the transmission window for the ultraviolet rays. The consequence is that most ultraviolet rays do not reach the photoresist resin film on the wafer surface.

Another demerit of this measure is that activated oxygen is deactivated by contact with ozone or some other gas. Thus, activated oxygen generally very briefly remains in an activated state. Therefore, activated oxygen produced in the vicinity of the light source or a transmission window for ultraviolet rays from oxygen is largely deactivated, before it comes into contact with the photoresist resin film on he wafer surface. It is, therefore, difficult to speed up the ashing reaction for a photoresist resin film by a low pressure mercury discharge lamp.

As described hereinbefore, it is considered disadvantageous in connection with this measure that the production of activated oxygen on the wafer surface is made difficult by the fact that light with a wavelength of 253.7 nm does not adequately reach the wafer surface. Also, activated oxygen, which is generated relatively far away from the wafer surface, i.e., close to the light source or transmission window for the ultraviolet rays, is immediately deactivated and, consequently, the ashing speed of the photoresist resin film is greatly reduced.

SUMMARY OF THE INVENTION

The object of the invention is to obviate the damage to a semiconductor device occurring during the ashing of a photoresist resin film by active oxygen plasma and also the very slow treatment during an ashing process in which, by means of light radiated from a low pressure mercury discharge lamp with a wavelength of 253.7 nm, activated oxygen is produced from ozone and a photoresist resin film is ashed by the activated oxygen.

According to the invention the object is achieved by the following method steps:

1. A semiconductor wafer provided with a photoresist resin film is placed in an ozone-containing atmosphere;
2. this atmosphere is irradiated with a high pressure discharge lamp, which emits a continous spectrum in a wavelength range of 200 nm to 300 nm;
3. as a result of this irradiation an activated oxygen is produced from ozone; and
4. the activated oxygen ashes the photoresist resin film.

The asher has a chamber filled with an ozone-containing atmosphere. A support or holder is arranged in the chamber and receives a wafer provided with a photoresist resin film. A discharge lamp emits light towards the photoresist resin film, with a continous radiation spectrum in a wavelength range of 200 to 300 nm.

Thus, in the invention, instead of use being made of a low pressure mercury discharge lamp which has a powerful line spectrum at a wavelength of 253.7 nm, use is made of a lamp which has a powerful, continuous spectrum in a wavelength range of 200 to 300 nm. According to the invention, it is, e.g., possible to use a high pressure mercury discharge lamp and/or a metal halide discharge lamp.

For the radiation light in a wavelength range of 200 to 300 nm, ozone mainly has, in a wavelength range of 200 to 240 nm or 270 to 300 nm, a smaller absorption coefficient than for light with a wavelength of 253.7 nm. Thus, the light in a wavelength range of 200 to 240 nm or 270 to 300 nm is not absorbed to a significant extent by ozone either in the vicinity of the light source, or in the vicinity of the transmission window for ultraviolet rays and, therefore, can reach the photoresist resin film on the wafer surface.

The ultraviolet rays which have come into the vicinity of the photoresist resin film on the wafer surface are absorbed there by the ozone. From the ozone an activated oxygen is produced. The activated oxygen can come into contact with the photoresist resin film, and adequately ash the latter, before coming into contact with the ozone or some other gas. Therefore, for increasing the ashing speed by the contact of the activated oxygen with the photoresist, in the vicinity of the surface of the latter, activated oxygen can be produced from the ozone and react with the photoresist resin in no time.

Another advantage of this measure is that by using a photochemical reaction in which activated oxygen is produced from ozone, the semiconductor device is not damaged by charged particles, as is the case with ashing by active oxygen plasma.

BRIEF DESCRIPTION OF THE DRAWINGS

The invention is described in greater detail hereinafter relative to embodiments and the attached drawings, wherein:

FIG. 2 is a table giving the test results obtained when ashing a photoresist resin film according to the method of the invention.

DESCRIPTION OF THE PREFERRED EMBODIMENT

Figure 1:
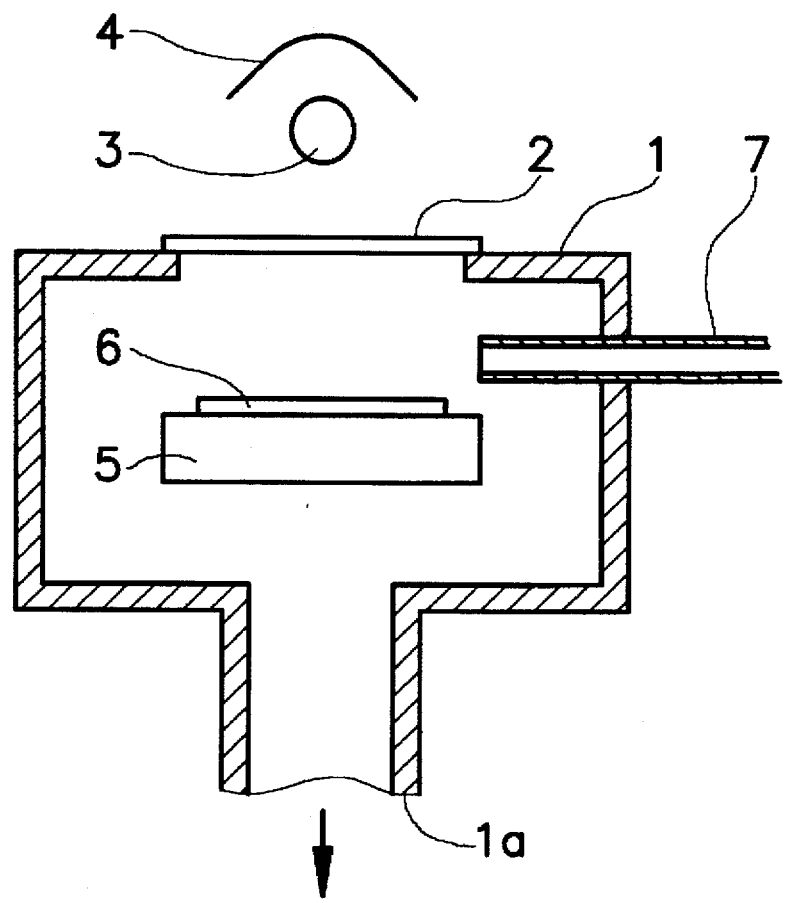
FIG. 1 shows a diagrammatic representation of a photoresist resin film asher according to the invention.

FIG. 1 diagrammatically shows an asher for performing the ashing method according to the invention. Reference numeral 1 designates a chamber for the ashing reaction. The chamber 1 is provided with a transmission window 2 for ultraviolet rays, which is, e.g., made from fused quartz glass and effectively transmits light emitted by a discharge lamp 3 in a wavelength range of 200 to 300 nm. Reference numeral 4 designates a reflector for ultraviolet rays. A wafer 6 is placed in a holder 5, whose surface is provided with a photoresist resin film. If necessary, a temperature controller, such as a heater, a watercooled tube or the like is embedded in the holder 5. The ozone-containing atmosphere gas is supplied from an ozonizer, which is not shown in the drawing, via a tube 7 to the chamber 1. The atmosphere gas remaining in the chamber after the completion of the ashing treatment of a photoresist film is exhausted out of an outlet port 1a.

Using the above-described asher a test is carried out to observe how the ashing speed with a discharge lamp emitting a continuous spectrum differs from the ashing speed of a discharge lamp emitting a line spectrum.

As the continuous spectrum discharge lamp use was made of the following three lamp types, i.e., a high pressure mercury discharge lamp having a fused quartz glass envelope, a high pressure mercury discharge lamp provided with a synthetic quartz glass bulb and a metal halide discharge lamp provided with a fused quartz glass bulb and in which mercury and a halide selected from a group of magnesium iodide, tin iodide and bismuth iodide are encapsulated. A conventional low pressure mercury discharge lamp was used for comparison purposes.

A known photoresist resin of type referred to as TSMR-8900 and sold by Tokyo Oka Industry A. G. was applied to the surface of the wafer in a thickness of 1.65 µm. The oxygen atmosphere within the chamber 1 is produced in such a way that the ozone concentration is at a volume of 8%. The radiation intensity of the rays from the above-described, four discharge lamps 3 in a wavelength range 200 to 300 nm is 100 mW/cm$^2$ at the wafer in the case of all four lamps.

With the aid of a table shown in FIG. 2, the result of the above-described test. In the table the treatment speed corresponds to the thickness of the photoresist resin film on the wafer which has disappeared by ashing after one minute. FIG. 2 makes it clear that the treatment speed with the three discharge lamps with continuous spectrum radiation in a wavelength range of 200 to 300 nm is four to six times higher than in the case of a low pressure mercury discharge lamp with a strong line spectrum radiation with a wavelength of 253.7 nm.

The possible reason why one ashing speed in the case of a high pressure mercury discharge lamp with a synthetic quartz glass bulb is higher than that with a high pressure mercury discharge lamp with a fused quartz glass bulb is that in the case of the high pressure mercury discharge lamp with the synthetic quartz glass bulb, there is a greater radiation of ultraviolet rays in a wavelength range of 200 to 230 nm. This makes it clear that although a synthetic quartz glass envelope is expensive, it is suitable as an envelope for an asher discharge lamp.

Generally a metal halide discharge lamp in a wavelength range of 250 to 300 nm has a powerful radiation, although its radiation is weak in a wavelength range of 200 to 250 nm. Therefore, the metal halide discharge lamp has the merit that the ashing speed does not change very much, even if the bulb or transmission window for ultraviolet rays is made from fused quartz glass, which, admittedly, relatively poorly transmits light with a wavelength range of equal to or less than 250 nm, but is relatively inexpensive.

The discharge lamp emitting a powerful continuous spectrum in a wavelength range of 200 to 300 nm need not be that which emits a continuous spectrum over the entire wavelength range of 200 to 300 nm. This means that the lamp can also be one which only partly emits a continuous spectrum within this wavelength range, such as, e.g., only in a wavelength range of 200 to 250 nm and/or 270 to 300 nm.

The high pressure mercury discharge lamp is a lamp in which the mercury vapour pressure during a lighting operation is equal to or higher than 100 Torr. In the case of the low pressure mercury discharge lamp of the present description, it is a lamp in which the mercury vapour pressure during lighting operation is equal to or lower than 10 Torr.

Figure 3:
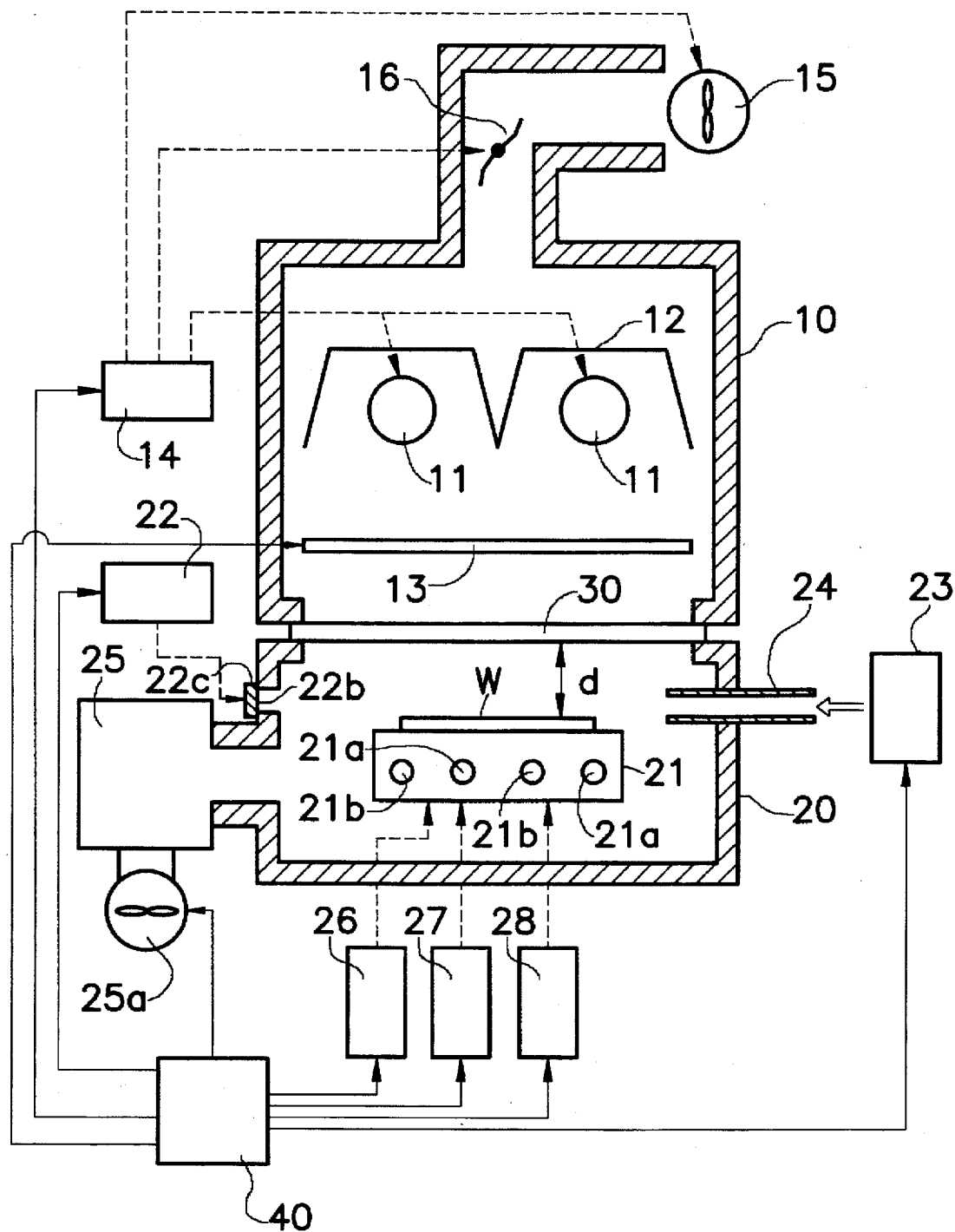
FIG. 3 is a diagrammatic representation showing an embodiment of a photoresist resin film asher according to the invention.

FIG. 3 specifically illustrates an asher for performing the ashing method according to the invention. The asher according to the invention comprises a light source room 10 and a chamber 20 between which is located a transmission window 30 for ultraviolet rays.

Two discharge lamps 11 and a reflector 12 are housed in the light source room 10. The reflector 12 deflects the radiation light from the discharge lamp 11 in the direction of a wafer W. As described hereinbefore, the discharge lamp 11 radiates, in a wavelength range of 200 to 300 nm, a continuous spectrum and can be a high pressure mercury discharge lamp or a metal halide discharge lamp.

If the wafer W is not required to be irradiated by the above-described radiation light, the latter can be switched off with a switch 13. The discharge lamp 11 is switched on with a power supply 14. The power supply 14 can also give a signal to a blower 15 and a throttle valve 16, so that the discharge lamp 11 is operated in an optimum, cooled state.

The chamber 20 contains a holder 21, which is, e.g., made from aluminium or copper, and the upper surface contacting with the wafer W, if required, is provided with an alloy plating of nickel and phosphorus, or a ceramic coating such as a silicon carbide or an alumina. A heater 21a and a water-cooled tube 21b are inserted as temperature controllers in the holder 21. Using the temperature controller, an ashing treatment can be performed with a constant optimum temperature of the wafer W. The holder 21 can also be rotated with a rotary drive, which is not shown in the drawings.

The wafer W, by using a wafer carrier 22, which is conventionally used in a semiconductor device production process, is, transferred on the holder 21. The wafer W is e.g., gripped with a wafer handler, a cover 22a is opened and, subsequently, the wafer W is conveyed through a wafer inlet/outlet 22b to the holder 21. Following an ashing treatment, the wafer W is in the same way removed from the chamber 20 with the wafer handler. The ozone in the chamber 20 is produced by an ozonizer 23, which is generally known and which can be, e.g., produced easily by a silent discharge of an oxygen gas. The ozone-containing atmosphere is supplied to the chamber 20 by means of a tube 24. Following an ashing treatment, the ozonizer 23 can be replaced by a nitrogen gas supply container, which is not shown in the drawing. Therefore, by means of the tube 24, nitrogen can be introduced into the chamber 20 and is used for purging the ozone-containing atmosphere left in the chamber 20. The ozone, if necessary, is also decomposed with an ozone decomposing apparatus 25. In this case, following the decomposition of the ozone, the atmospheric gas is removed to the outside by a blower 25a.

The temperature controller, which is incorporated into the holder 21, is controlled by a prior art temperature controller regulating device 26, such as, e.g., a temperature sensor. The holder 21 is also provided with a vacuum chuck, which is not shown in the drawing. The vacuum chuck is used for fixing the wafer W onto the holder 21 and is controlled by a vacuum chuck controller 27.

In addition, for changing the distance d between the transmitting window 30 for ultraviolet rays and the surface of the wafer W, a regulator 28, which moves the holder 21 up and is provided. This distance d must be correctly set, so that activated oxygen is produced in the vicinity of the wafer surface. The distance is, e.g., 0,5 to 7 mm. The transmitting window 30 for ultraviolet rays is e.g. made from quartz glass. The power supply 14 and other regulators are also controlled by an interconnection via a system controller 40.

Figure 4:
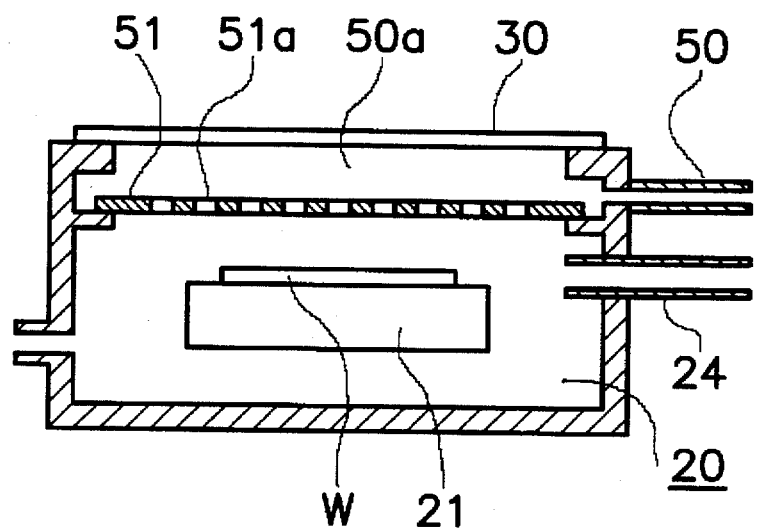
FIG. 4 is a diagrammatic representation showing in simple form, another embodiment of a photoresist resin film asher according to the invention.

FIG. 4 illustrates another embodiment of the asher according to the invention. As the same reference numerals used in FIG. 3 designate the same parts in FIG. 4 they those parts, are not explained again here. FIG. 4, only illustrates parts of the chamber 20, because this embodiment relates to the latter.

In the case of the asher of FIG. 4 a supply tube 50 for an inert gas is placed alongside the tube 24 in the chamber 20. Between the transmitting window 30 for ultraviolet rays and a porous window 51 is formed an inert gas room 50a, which is filled with the inert gas supplied from the tube 50. The inert gas is, for example, nitrogen or argon which in a wavelength range of 200 to 300 nm, has no absorption band. The porous window 51 separates the treatment chamber 20 with the ozone-containing atmosphere from the inert gas room 50a. The porous window 51 is also made from fused quartz glass in the same way as the ultraviolet ray transmitting window 30.

Figure 5:
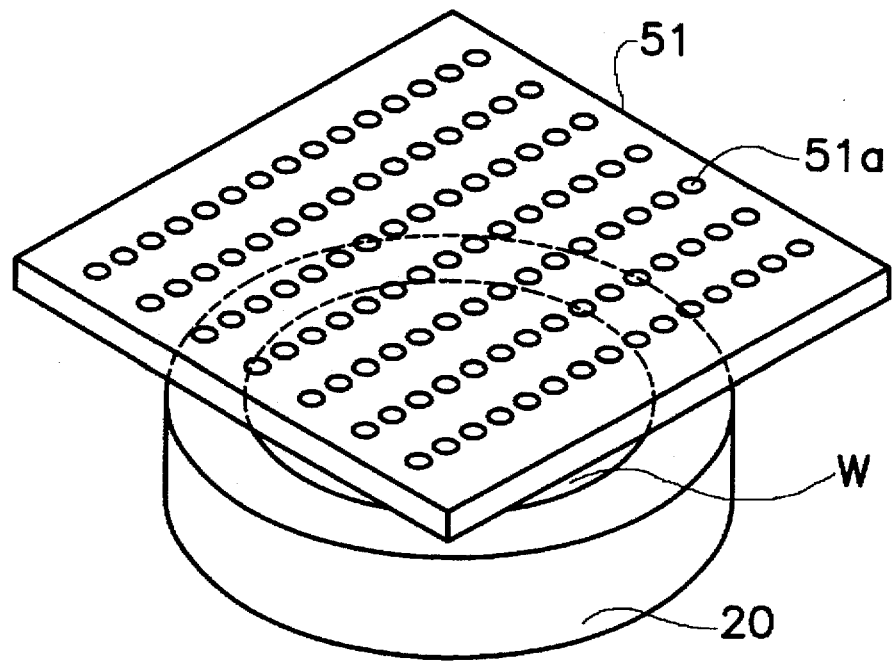
FIG. 5 is a view of the embodiment of the photoresist resin film asher according to FIG. 4 in perspective.

The porous window 51 is provided with a plurality of pores 51a, which have a minimum reciprocal spacing. This state is illustrated, a perspective view, in FIG. 5. As a result of this arrangement, the inert gas can be uniformly distributed over the surface of the wafer W. For example, pores with a diameter of 0,4 mm are arranged with an identical spacing of 4 mm. The wafer fixed on the holder 21 can homogeneously contact the inert gas or ozone supplied by rotating the holder 21.

Because of the inert gas flow the ozone-containing gas does not flow into the inert gas room 50a. Furthermore, due to the inert gas flowing out of the pores 51a, the ozone concentration in the chamber 20 is lower in the vicinity of the porous window 51. Thus, by reduced absorption of ultraviolet rays close to the inert gas room 50a and the porous window 51, ultraviolet rays can come close to the wafer surface, which accelerates the production there of activated oxygen from the ozone. This speeds up the ashing treatment.

However, an excessive inert gas flow rate influences the ozone concentration in the vicinity of the wafer surface. It is, therefore, possible to, e.g., set an inert gas flow rate of 1 liter/minute for an ozone-containing gas flow rate of 10 liters/minute. In this embodiment the ashing speed is increased by approximately 20% as compared with the asher of the embodiment of FIG. 3.

Figure 6:
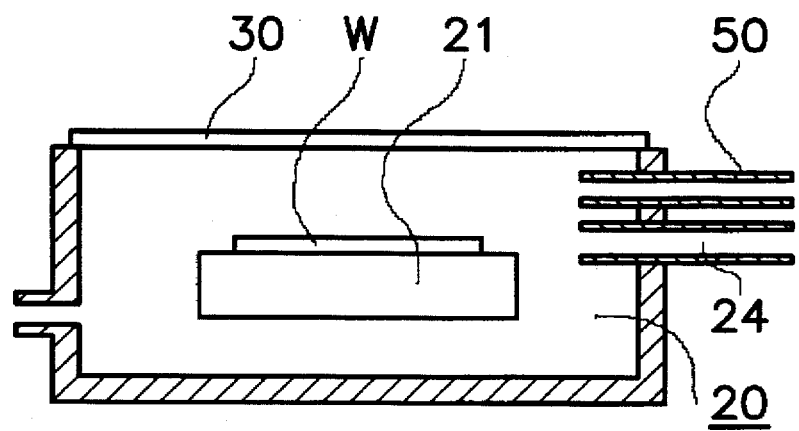
FIG. 6 is a diagrammatic representation showing in simple manner form another embodiment of a photoresist resin film asher according to the invention.

FIG. 6 illustrates a further embodiment in which neither a porous window nor an inert gas room are provided. This means that a direct flow of an inert gas and ozone-containing gas into the chamber 20 is possible. In this case, parallel to the ultraviolet ray transmitting window, an inert gas is allowed to flow in layers into the chamber 20, i.e., the tube 50 is positioned between the ultraviolet ray transmitting window 30 and the tube 24 for ozone-containing gas.

While it is possible to use the asher with the construction described in the embodiment, in which an ozonizer outside the chamber is used and, consequently, an ozone-containing atmosphere is introduced into the chamber, in its also possible to use a method, in which oxygen is supplied in layers along the wafer surface, in which ozone is produced from the oxygen by ultraviolet rays in a wavelength range of equal to or below 200 nm and by producing activated oxygen from the ozone by ultraviolet rays in a wavelength range of 200 to 300 nm. The means by which a layer-like gas flow is produced is not described here, because it is already known.

The transmitting window for ultraviolet rays is also not absolutely necessary, because a discharge lamp can be positioned within the treatment chamber.

EFFECT OF THE INVENTION

According to the photoresist ashing method and the asher according to the invention, the light in a wavelength range of mainly 200 to 240 nm or 270 to 300 nm reaches the photoresist resin film on the wafer surface. This is because for the radiation light in a wavelength range of 200 to 300 nm, ozone mainly has, in a wavelength range of 200 to 240 nm, or 270 to 300 nm a smaller absorption coefficient and, therefore, there is only a limited reaction with the ozone in the vicinity of the light source or an ultraviolet ray transmitting window. The ultraviolet rays, which have reached the photoresist resin film on the wafer, produce an activated oxygen there from the ozone, which can come into contact with the photoresist resin film and adequately ash it prior to contact with the ozone or some other gas. This means that for increasing the ashing speed by the contact of the activated oxygen with the photoresist an activated oxygen is produced from the ozone in the vicinity of the photoresist surface.

Another effect of the invention is that through the use of a photochemical reaction, such as producing activated oxygen from ozone, the damage to a semiconductor device by charged particles occurring on ashing by active oxygen plasma is avoided.

It is to be understood that although preferred embodiments of the invention have been described, various other embodiments and variations may occur to those skilled in the art. Any such other embodiments and variations which fall within the scope and spirit of the present invention are intended to be covered by the following claims.

What is claimed is:

1. A method for ashing a photoresist film on a semiconductor wafer comprising the steps of:

setting a semiconductor wafer in a chamber filled with an atmosphere containing ozone;

irradiating the semiconductor wafer and ozone with radiation from a high pressure mercury discharge lamp having a continuous spectrum in a wavelength region of 200 nm to 300 nm with the oxygen from the ozone near the semiconductor wafer being activated with light primarily in the wavelength regions of 200 nm to 240 nm and 270 nm to 300 nm but not between 240 nm and 270 nm; and keeping a distance between a window for ultraviolet rays and a surface of the semiconductor wafer constantly in a range of 0.5 mm to 0.7 mm so that ashing of said photoresist film proceeds at a speed no less than 2.0 µm/min and no greater than 3.0 µm/min.

2. A method as claimed in claim 1, wherein said lamp contains a metal halide.

* * * * *

UNITED STATES PATENT AND TRADEMARK OFFICE
CERTIFICATE OF CORRECTION

PATENT NO. : 5,677,113
DATED : October 14, 1997
INVENTOR(S) : Shiniji Suzuki, Kyohei Seki, Nobutoshi Ebashi, Tetsuji Arai It is certified that error appears in the above-indentified patent and that said Letters Patent is hereby corrected as shown below:

Column 8, line 12, "0.5 mm to 0.7 mm" should read -- 0.5 to 7.0 mm --

Signed and Sealed this

Twenty-first Day of July, 1998

Attest:

BRUCE LEHMAN

Attesting Officer

Commissioner of Patents and Trademarks